US005550102A

United States Patent [19]
Nakai et al.

[11] Patent Number: 5,550,102
[45] Date of Patent: Aug. 27, 1996

[54] SUPERCONDUCTOR AND METHOD OF MANUFACTURING THE SAME

[75] Inventors: Yoshihiro Nakai; Kazuo Sawada; Kazuhiko Hayashi; Masanobu Nishio, all of Osaka, Japan

[73] Assignee: Sumitomo Electric Industries, Ltd., Japan

[21] Appl. No.: 942,481

[22] Filed: Sep. 9, 1992

Related U.S. Application Data

[63] Continuation of Ser. No. 800,876, Nov. 27, 1991, abandoned, which is a continuation of Ser. No. 175,437, Mar. 30, 1988, abandoned.

[30] Foreign Application Priority Data

| Apr. 2, 1987 | [JP] | Japan | 62-81819 |
| Apr. 10, 1987 | [JP] | Japan | 62-89633 |
| Apr. 11, 1987 | [JP] | Japan | 62-89234 |
| Sep. 18, 1987 | [JP] | Japan | 62-235874 |

[51] Int. Cl.$^6$ .................... H01B 12/00; H01L 39/24; B29C 47/00; B29C 47/88
[52] U.S. Cl. ............. 505/420; 505/430; 505/450; 505/451; 505/470; 505/740; 505/733; 505/741; 29/599; 264/85; 264/211.11
[58] Field of Search ............. 505/1, 733, 740, 505/741, 420, 430, 450, 451, 470; 29/599; 264/85, 211.11

[56] References Cited

U.S. PATENT DOCUMENTS

| 2,544,763 | 4/1947 | Montero | 264/164 |
| 3,838,185 | 9/1974 | Maringer et al. | 264/165 |
| 3,856,074 | 12/1974 | Kavesh | 264/164 |
| 3,868,241 | 2/1975 | Felice et al. | 65/134 |
| 4,031,609 | 6/1977 | Ziegler et al. | 29/599 |
| 4,339,508 | 7/1982 | Tsuya et al. | 428/606 |
| 4,374,799 | 2/1983 | le Clerc de Bussy | 264/332 |
| 4,973,574 | 11/1990 | Nishio et al. | 505/740 |
| 5,140,004 | 8/1992 | Tanaka et al. | 505/420 |

FOREIGN PATENT DOCUMENTS

| 81819 | 4/1987 | Japan . |
| 89633 | 4/1987 | Japan . |
| 89234 | 4/1987 | Japan . |
| 235874 | 9/1989 | Japan . |

OTHER PUBLICATIONS

"Possible High TC Superconductivity in the Ba–Le–Cu–O System" Bednorz and Müller, Condensed Matter 64, 1986.
"Bulk Superconductivity at 36 K in $La_{1.8} Sr_{0.2}CuO_4$," Caua et al. Phys Rev Let vol. 58 No. 4 26 Jan. 87.
"High Pressure Study of the New Y–Ba–Cu–O Superconducting Compound System", Hor et al. Phys Rev. Let. vol. 58 No. 9 2 Mar. 87.
"Electron–Phonon Interaction in the New Superconductors $La_{2-x} (Ba;Sr)_x CuO_x$,"Weber, Phys Rev. Letters vol. 58 No. 13 30 Mar. 87.
"Lattice Instability and High $T_c$ Superconductivity in $La_{2-x}Ba_xCuO_y$," Jorgensen et al.—Phys Rev. Letters 9 Mar. 1987. vol. 58 No. 10.
"Superconductivity at 93 K in a New Mixed Phase Y–Ba–Cu–O Compound System at Ambisait Pressure", Wu et al. Phys Rev. Letters vol. 58 No. 9, 2 Mar. 87.
"Evidence for Superconductivity Above 40 K in the La–Ba–Cu–O Compound System", Chu et al. Phys Rev. Let. vol. 58 No. 4 26 Jan. 87.

(List continued on next page.)

Primary Examiner—Melissa Bonner
Attorney, Agent, or Firm—Pennie & Edmonds

[57] ABSTRACT

A method of manufacturing a superconductor is carried out by first preparing a material composed of $Y_1Ba_2Cu_3O_7$. This material is heated/molten in a platinum crucible. A melt thus obtained is drawn out from a high-temperature frame provided above the platinum crucible and heated to a temperature exceeding the melting point of the material. The melt thus drawn out is cooled by natural standing, to be solidified. As the result, an elongated superconductor composed of $Y_1Ba_2Cu_3O_7$ can be obtained. This superconductor enters a superconductive state at 90 K.

12 Claims, 5 Drawing Sheets

OTHER PUBLICATIONS

"High $T_c$ Superconductivity of a Melt–Spun Er.BazCu$_3$ Oxide Ribbon", —Jap. J. of App. Phys. vol. 26, No. 8. 1987 pp. L1384–1387 Matsuzaki et al.

"Superconductivity"—Bob Beyers, Stanford Observer May 1988.

"Rapid Solidification of Oxide Superconductors in the Y–Be–Cu–O System." Adv. Ceram. Matls. [2] #3B Jul. 1987 pp. 353–363 McKittrick et al.

"Problems in the Production of YBa$_z$Cu$_3$O$_x$ Superconducting Wire."—Adv. Ceram Matls. vol. 2 #3B 1987. R. W. McCallum et al.

"Texture Development in YBe$_z$Cu$_3$O$_x$ By Hot Extrusion and Hot–Pressing", Chen et al., J. Am. Ceram. Soc. 70[12] C–388–C–390 (1987).

"Fabrication of Dense Be$_z$YCu$_3$O$_{7-\delta}$ Superconductor Wire By Molten Oxide Processing" App. Phys. Letters —Submitted Jul. 2, 1987 for Sep. 28. Pub. Jin et al.

Showa Densen Denren, K. K., JP–A–567487, Patent Abstracts of Japan, vol. 5, No. 55, (E–52) (727), Apr. 16, 1981.

Matsuzaki et al "High $T_c$ Superconductivity of a Melt–Spun ErBa$_2$Cu$_3$ Oxide Ribbon", *Jap. Jour. Appl. Phy.*, vol. 26, No. 8; Aug. 1987; pp. L1384–L1387.

Jin et al, "Fabrication of dense Ba$_2$YCu$_3$O$_{7-\delta}$ superconductor wire by molten oxide processing", *Appl. Phys. Lett.*, vol. 51, No. 12; pp. 943–945; Sep. 21, 1987.

McKittrick et al, "Rapid Solidification of Oxide Superconductors in the Y–Ba–Cu–O System", *Adv. Cerm. Mat'l.*, vol. 2, No. 3B; Jul. 1987, pp. 353–363.

SUPERCONDUCTOR AND METHOD OF MANUFACTURING THE SAME

This application is a continuation of application Ser. No. 07/800876, filed Nov. 27, 1991, now abandoned, which is a continuation of application Ser. No. 07/175437, filed Mar. 30, 1988, now abandoned.

BACKGROUND OF THE INVENTION

The present invention relates to a method of manufacturing a superconductor of ceramics, and more particularly, it relates to a method of manufacturing a superconductor, which comprises steps of melting a raw material and thereafter solidifying the same.

DESCRIPTION OF THE PRIOR ART

A superconductive material of ceramics has recently been studied that superconducts at a higher critical temperature. A superconductor of such a ceramic superconductive material is formed by press-forming a raw material of ceramics powder and sintering the same. The sintered body may be temporarily fired in advance to glost firing after press forming, as the case may be.

In the conventional method employing powder sintering, the length of the superconductor has been restricted to that of a mold for press forming. Thus, it has been extremely difficult to elongate the conventional superconductor in order to apply the same to a conductor for forming a coil for a high current density magnet or a long-distance transmission line for making the best use of its superconductivity. Further, in the conventional method, complicated steps have been required for manufacturing an elongated body thus leading to difficulties in production.

In the aforementioned conventional sintering method, the superconductor has been restricted in terms of manufacturable configurations. Further, it has been difficult to obtain a dense superconductor because of voids remaining after sintering. Thus, it has been impossible to attain high critical current density in a superconductor obtained by the sintering method. In addition, it has been difficult to control the crystal structure of the superconductor in the sintering method.

SUMMARY OF THE INVENTION

An object of the present invention is to provide a method of efficiently manufacturing an elongated superconductor which is composed in design of a ceramic superconductive material, and a superconductor obtained by the said method.

The present invention provides a method of manufacturing a superconductor made of a ceramic superconductive material, preferably a material which comprises a layer structure compound containing oxygen and at least two sorts of metal elements.

The present invention provides a method of manufacturing a ceramic superconductor of a composition generally expressed in a formula AaBbCc. In this general formula, $\underline{A}$ represents at least a single sort of element, preferably at least two sorts of elements selected from a group of those belonging to the groups Ia, IIa and IIIa of the periodic table. The elements belonging to group Ia of the periodic table are H, Li, Na, K, Rb, Cs and Fr. The elements belonging to group IIa of the periodic table are Be, Mg, Ca, Sr, Ba and Ra. The elements belonging to group IIIa of the periodic table are Sc, Y, La, Ce, Pr, Nd, Pm, Sm, Eu, Gd, Tb, Dy, Ho, Er, Tm, Yb, Ly, Ac, Th, Pa, U, Np, Pu, Am, Cm, Bk, Cf, Es, Fm, Md, No and Lr.

On the other hand, $\underline{B}$ in the general formula represents at least a single sort of element selected from a group of those belonging to the groups Ib, IIb and IIIb of the periodic table. The elements belonging to group Ib of the periodic table are Cu, Ag and Au and those belonging to group IIb of the periodic table are Zn, Cd and Hg, while those belonging to group IIIb of the periodic table are B, Al, Ga, In and Tl.

$\underline{C}$ represents at least a single sort of element selected from a group of oxygen, carbon, nitrogen, fluorine and sulfur.

The general $\underline{a}$, $\underline{b}$ and $\underline{c}$ represent numbers showing the composition ratio of $\underline{A}$, $\underline{B}$ and $\underline{C}$ respectively. While the relation of $\underline{a}\times$(average valence of A)+$\underline{b}\times$(average valence of B)=$\underline{c}x$ (average valence of C) generally holds for $\underline{a}$, $\underline{b}$ and $\underline{c}$, satisfaction of such a relation is not necessarily required.

Preferably at least copper is contained as $\underline{B}$ and at least oxygen is contained as $\underline{C}$ in the aforementioned final composition, for the possibility of superconduction at a higher critical temperature.

In the method of manufacturing a superconductor according to the present invention, first prepared is a raw material of layer structure compound containing oxygen and at least two sorts of metal elements, or a raw material of the composition generally expressed in the formula AaBbCc. This raw material is molten in a vessel having an opening. A melt of AaBbCc obtained by said melting is drawn out through a frame provided in the vessel opening and which is heated to a temperature exceeding the melting point of the raw material. The melt thus drawn out is solidified. Such solidification may be performed through forced cooling or natural cooling by standing.

According to the inventive manufacturing method, the melt of the aforementioned material is drawn out from the high-temperature frame to be solidified, thereby forming a conductor. Thus, an elongated superconductor can be stably obtained with small drawing force, requiring no complicated mold or steps for obtaining an elongated body. Further, elongated conductors can be continuously manufactured.

A deformed or tape-like conductor can be easily obtained in addition to a conductor having a circular sectional configuration by selecting the configuration of a portion of the high-temperature frame for passing the melt.

The melt can be cooled with an abrupt temperature gradient to increase the speed for drawing out the same, thereby providing a method to efficiently manufacture an elongated superconductor. Further, an elongated superconductor of a unidirectionally solidified member or a monocrystal body can be manufactured.

If the superconductive material such as an oxide existing in layer structure has a high melting point and requires protection against contamination in manufacturing, the high-temperature frame and the crucible for melting the raw material are preferably formed by an appropriate material selected from a group of platinum, rhodium, iridium, platinum alloy, rhodium alloy, iridium alloy and boride ceramics, in order to obtain a superconductor of desired composition.

According to the present invention, the raw material is molten and drawn out from the high-temperature frame to be solidified thereby obtaining a superconductor. Thus, an elongated superconductor can be stably and efficiently manufactured at a low cost. Further, the material is drawn out from the high-temperature frame, so that elongated superconductors of various sectional configurations such as those in the form of fine wires including deformed ones and a tape-like superconductor can be easily obtained by appropriate designing of the sectional configuration of the high-temperature frame.

Thus, it is possible for industry to mass produce superconductors which are optimum for forming long-distance transmission lines and coils for a high current density magnet, in order to make the most effective use of characteristics of superconductors.

It is pointed out that the inventive manufacturing method is also applicable to manufacturing of a superconductor other than an elongated one.

In the aforementioned melting-solidifying method according to the present invention, it is difficult to obtain a ceramic superconductor that is properly composed in design even if the composition of the raw material is correctly prepared. The composition is easily fluctuated particularly by dissociation or coupling of elements contained in the raw material while in a molten state. In consideration of this, the inventors have found out that a ceramic superconductor properly composed in design can be reliably obtained by adjusting the atmosphere in at least one of the overall manufacturing steps including the melting, cooling, and solidifying steps.

According to the inventive method of manufacturing a superconductor based on the aforementioned point of view, in order to manufacture a ceramic superconductor of the aforementioned composition, a raw material is prepared which is expressed by the general formula $AaBbC^xc^x$. In this general formula, $C^x$ represents at least a single sort of element selected from a group of oxygen, carbon, nitrogen, fluorine and sulfur, which may be identical to the aforementioned $\underline{C}$. If $\underline{C}$ consists of two or more sorts of elements, $C^x$ may be prepared by a part thereof. In this general formula, $c^x$ represents a number showing the composition ratio of $C^x$.

In the inventive manufacturing method, the material expressed as $AaBbC^xc^x$ is first melted. The inventive method further comprises at least a step of drawing out a melt of $AaBbC^xc^x$ obtained by said melting through a frame provided in an outlet for the melt and which is heated to a temperature exceeding the melting point of the raw material and a step of solidifying the melt of $AaBbC^xc^x$ thus drawn out.

The present invention may comprise at least the melting step, the drawout step and the solidifying step, while some steps may be freely performed after the solidifying step.

The solidifying step may be performed by natural standing or forced cooling. In case of forced cooling, the melt can be drawn out at a higher speed, to more efficiently produce an elongated superconductor.

The inventive manufacturing method is further characterized in that at least one of the steps including the aforementioned melting step, drawout step and solidifying step is performed under an atmosphere containing a $C^y$ component of partial pressure higher than the $C^y$ partial pressure in the atmospheric air. The $C^y$ component is prepared with a gas containing at least a single type of element selected from the group of oxygen, nitrogen, carbon, fluorine and sulfur, which may be identical to $\underline{C}$ in the aforementioned general formula that expresses the final composition. If $\underline{C}$ consists of two or more types of elements, $C^y$ contains at least the difference between $\underline{C}$ and $C^x$, i.e. that left by eliminating $C^x$ from $\underline{C}$. This $C^y$ gas may be prepared with oxygen, nitrogen, carbon monoxide, carbon dioxide, hydrogen fluoride or hydrogen sulfide, for example.

The aforementioned atmosphere in which the $C^y$ partial pressure is higher than that in the atmospheric air may be introduced into "at least" one of the overall manufacturing steps. Hence, it is possible that only the melting step may be performed under the said atmosphere; alternatively, it is possible that only the drawout step or the solidifying step may be performed under the said atmosphere. The melting, drawout or solidifying steps are carried out under the said atmosphere in order to perform melting, drawout or solidification in the atmosphere which is rich in $C^y$. Therefore, if $C^x$ is smaller in sort or amount of element than $\underline{C}$ in the final composition, $C^y$ can be added to the material in a molten, drawn-out or cooled state from the $C^y$ atmosphere. Thus, Cc in the final composition can be reliably implemented.

On the other hand, if $C^x$ contained in the material is identical to $\underline{C}$ in the final composition, dissociation of the C component in the material can be suppressed in the molten state or a state prior to solidification by preparing $C^y$ to be identical in element to $C^x$ and $\underline{C}$. Even if the C component is dissociated, it can be recombined in a desired state.

After the solidifying step, the material can be reheated under an atmosphere in which the $C^y$ partial pressure is higher than that in the atmospheric air. In this case, the C component in the final composition can be attained by supplying the $C^Y$ component through the re-heating step.

The superconductor obtained according to the present invention is drawn out from the high-temperature frame to be solidified, whereby a superconductor of a monocrystal body structure or a unidirectionally solidified body structure can be easily obtained.

It is pointed out that the material expressed as $AaBbC^xc^x$ can be prepared not only by a mixed body or a compact, but also by a partially fabricated item, which is in incomplete superconduction.

Thus, according to the inventive manufacturing method, dissociation or change of elements in a molten state can be effectively prevented by partially adjusting an atmosphere in the steps, while a component not contained in the raw material can be supplied from an atmosphere, as the case may be. Thus, a ceramic superconductor can be reliably composed in design.

The aforementioned melting-solidifying method according to the present invention may include a step of passing an elongated base material through a melt in a frame portion which has been heated to a temperature exceeding the melting point of a raw material, by which the melt is applied to the base material. Thus, a superconductor of a base material coated with a solidified body of a ceramic superconductive material can be manufactured by drawing out the base material applied with the melt and then solidifying the melt.

In this manufacturing method, the step of passing the base material through the melt in the frame portion may be performed by moving the melt in a passage portion provided between an opening in a vessel and the frame portion for the purpose of supplying the melt into said frame.

According to the inventive manufacturing method, a superconductor can be obtained by simply passing the base material through the melt of the superconductive material, whereby an elongated superconductor can be efficiently and stably manufactured. As hereinafter described with reference to Example, the superconductive material can be provided in a desired thickness around the base material by controlling the speed of passing the base material through the melt or by passing the base material through the melt multiple times. Further, the sectional configuration of the superconductor obtained is controlled by the sectional configuration of the frame portion or the like, by which a superconductor of a desired sectional configuration such as a circular one or a flat one can be obtained.

The superconductive material can be molten in an atmosphere containing a large amount of oxygen, carbon, nitrogen, fluorine or sulfur, which is an element forming the superconductive material, to compensate for shortages of such an element caused by the melting, thereby obtaining a superconductor of excellent superconductivity.

The present invention is first characterized in that the conventional sintering method is not employed but rather steps of melting a raw material and thereafter solidifying the same are employed. While it is known that a superconductor composed of $Y_1Ba_2Cu_3O_x$, for example, has a high superconductivity transition temperature of 90 K, for example, it has been experimentally found out that the raw material employed in the melting and solidifying steps must be within a specific composition range in order to obtain such a superconductor having a relatively high superconductivity transition temperature.

Thus, the present invention is secondly characterized in that a raw material to be molten and solidified is a composite oxide of $YO_{1.5}$, BaO and CuO in a composition region enclosed by three points of CuO, A (50 at. % $YO_{1.5}$ 25 at.%BaO—25 at. % CuO) and B (50 at. % BaO—50 at. % CuO), excluding the line CuO—B, in a three-component composition diagram of respective 5 oxides of yttrium, barium and copper as shown in FIG. 1.

In the present invention, said composite oxide is preferably selected so that composition of $YO_{1.5}$, BaO and CuO is in a region enclosed by three points of C (10 at. % $YO_{1.5}$ 20 at. % BaO—70 at. % CuO), D (30 at. % $YO_{1.5}$—30 at. % BaO—40 at. % CuO) and E (5 at. % $YO_{1.5}$—45 at. %BaO—50 at. % CuO) in the three-component composition diagram as shown in FIG. 1.

In a preferred embodiment of the present invention, a raw material of composition shown in the aforementioned three-component composition diagram is molten in a platinum crucible, to be solidified by a crucible solidifying process, casting, a quenching method, a unidirectional solidifying method, a "spinning method" of extruding or drawing out a melt from a hole communicating with the interior of a crucible to cool and solidify the same, "hot mold casting" of drawing out a melt through a frame of a high temperature exceeding the melting point provided in an outlet for the melt and solidifying the same, a "pipe suction method" of filling a melt in a pipe and solidifying the same, a "dipping method" of passing a core member through a molten solution to solidify the same around the core member or "movable mold casting" of casting a melt in a mold which is movable with respect to a casting position for the melt thereby to cast the same. Preferably a solidified body thus obtained is held in a temperature range of 800° to 1000° C. for at least two hours, to be thereafter cooled at a speed not more than 200° C./h.

The aforementioned melting and solidifying steps and/or the steps of holding the solidified body in a prescribed temperature range for at least a prescribed time and thereafter cooling the same at a prescribed speed are preferably performed in an oxygen atmosphere of at least 0.2 atm.

In the present invention, it has been found out that a solidified body obtained by solidifying a melt of a composite oxide within the composition range enclosed by CuO—A—B in FIG. 1 has a high volume ratio of a $Y_1Ba_2Cu_3O_x$ superconductive phase, to be in excellent superconductivity. It has also been found out that the superconductivity transition temperature of the solidified body exceeds the temperature of liquid nitrogen if the composition thereof is in a range enclosed by the points C, D and E in FIG. 1.

It has been experimentally confirmed that, although the composition of a raw material can be simply selected so that Y, Ba and Cu are in the ratio 1:2:3 in order to obtain a superconductor composed of $Y_1Ba_2Cu_3O_x$ by the conventional sintering method, the composition of the raw material cannot be so simply selected in steps of the present invention including the melting and solidifying steps. In other words, it has been recognized that a melt being composed of $Y_1Ba_2Cu_3O_x$ is separated in solidification into a plurality of phases different in composition, whereby the volume ratio of the composition of $Y_1Ba_2Cu_3O_x$ is rather reduced. It has been also confirmed that, if a melt being composed of $Y_1Ba_2Cu_3O_x$ is simply solidified in order to obtain a superconductor having a high superconductivity transition temperature, a superconductive state may not be attained even at a temperature of 4.2 K (liquid helium temperature).

According to the present invention, a melt of prescribed configuration is solidified in various techniques, thereby obtaining a dense superconductor of high critical current density and having an arbitrary configuration. Thus, the manufacturing method of the present invention can be advantageously applied to a method of manufacturing a Y Ba Cu oxide superconductor, which is generally applicable to a superconductor for a high current density magnet or a long-distance transmission line.

In a preferred embodiment of the present invention, a platinum crucible is employed to perform the melting step, in order to minimize reaction of the melt with the crucible to within a range that causes no problems in practice. In other words, no bad influence is exerted on superconductivity even if platinum contaminates the superconductor thus obtained.

While the step of solidifying the melt in the present invention may be performed by any method well known in the art, the melt is held in a temperature range of 800° to 1000° C. for at least two hours upon solidification and thereafter cooled at a speed of not more than 200° C./h in the preferred embodiment, as hereinabove described. Said process is adapted to compensate for the shortage of oxygen being dissociated in melting, as well as to perfect phase transformation of a $Y_1Ba_2CuO_3O_x$ phase, i.e., phase transformation from a tetragonal system into a rhombic system, which is effective for superconductivity.

In the preferred embodiment of the present invention, the melting and solidifying steps and/or the aforementioned steps after solidification are performed in an oxygen atmosphere exceeding prescribed atmospheric pressure, as hereinabove described. Thus, the tendency for there to be a shortage of oxygen in the obtained superconductor can be prevented.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
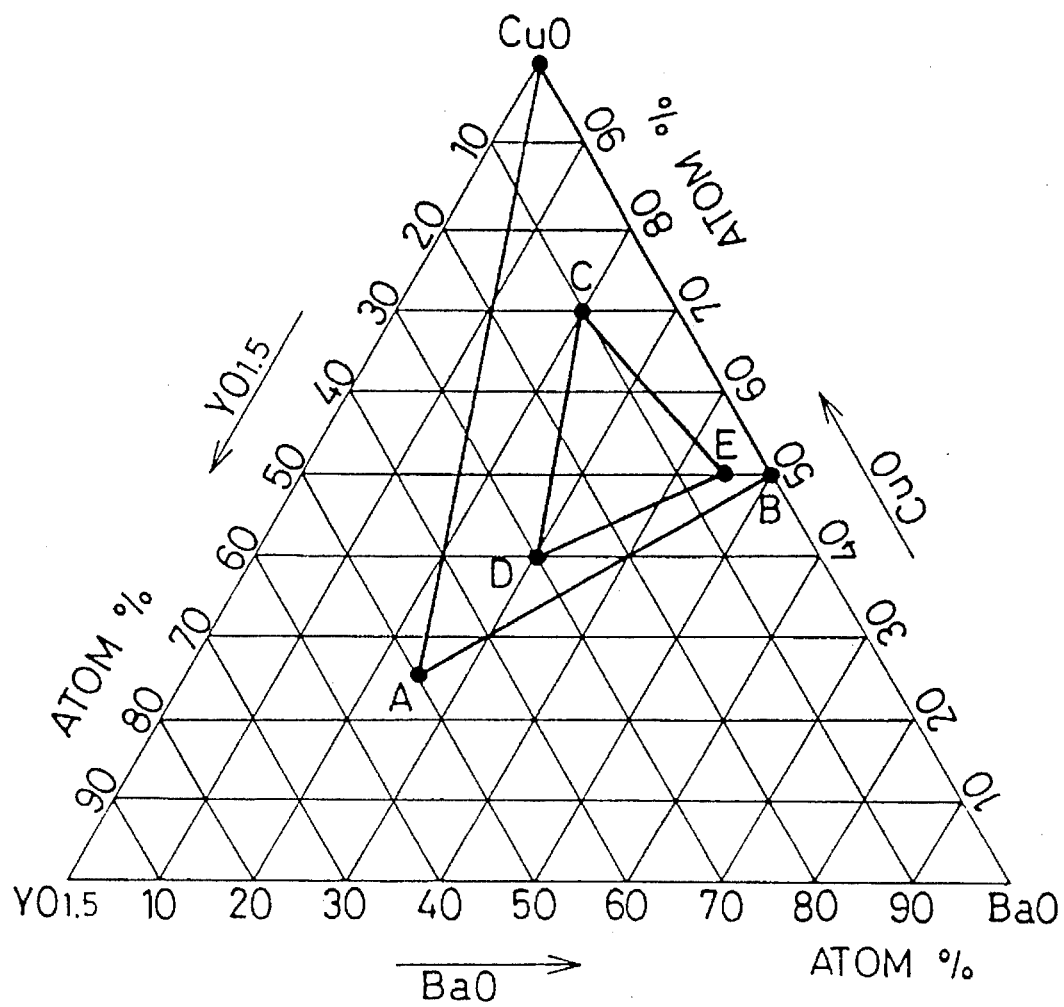
FIG. 1 is a three-component composition diagram showing composition of a Y—Ba—Cu—O raw material which is employed to be molten in a method of manufacturing a superconductor according to the present invention.
Figure 2:
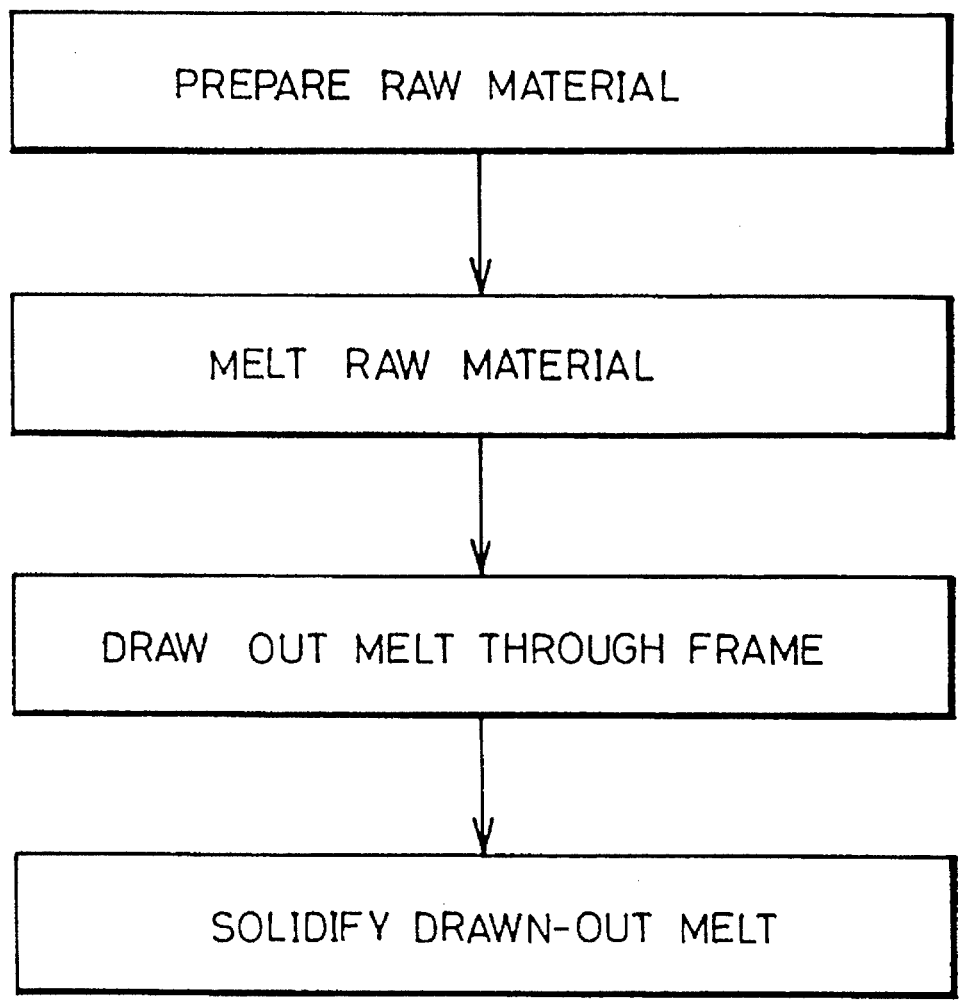
FIG. 2 is a schematic process diagram showing steps of a method of manufacturing a superconductor according to the present invention.

FIG. 2 is a process diagram schematically showing a method of manufacturing a superconductor according to the present invention. Referring to FIG. 2, a raw material of prescribed composition is first prepared in the form of powder or a compact. This raw material is molten in a vessel having an opening portion. A melt thus obtained is drawn out through a frame which is provided in the opening portion and heated to a temperature exceeding the melting point of the raw material. The melt thus drawn out is thereafter cooled to be solidified. Thus, a superconductor of prescribed composition is obtained in the form of a solidified body. The inventive method of manufacturing a superconductor is now described with reference to Examples.

EXAMPLE 1

Figure 3:
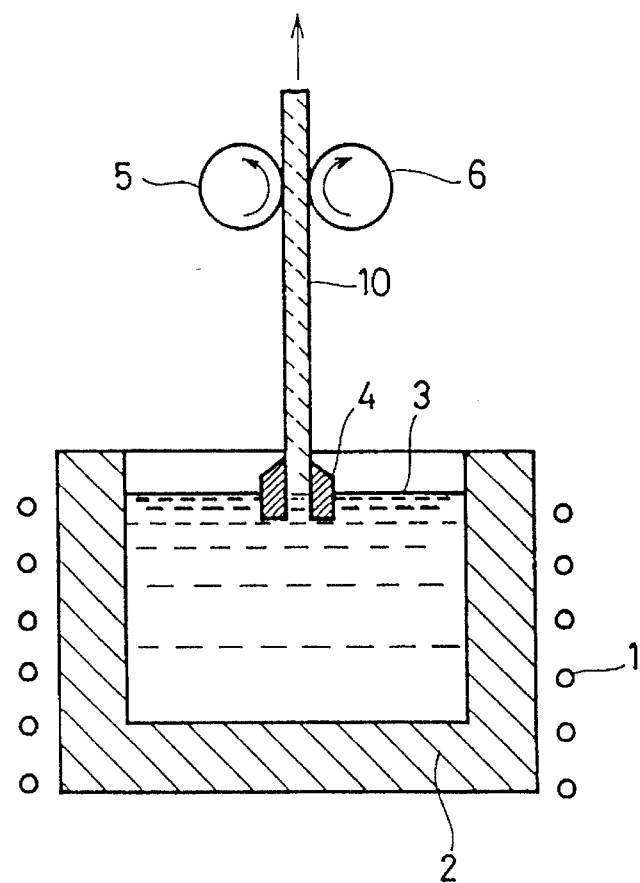
FIG. 3 is a sectional view schematically showing an apparatus employed for carrying out the first Example of the present invention.

An apparatus as shown in FIG. 3 was employed to form an elongated ceramics superconductor. Referring to FIG. 3, numeral 1 indicates a heater and numeral 2 indicates a crucible, while numeral 3 indicates a melt and numeral 4 indicates a high-temperature frame which is provided on the melt 3. Numerals 5 and 6 indicate rolls, which are rotated along arrows in the figure, in order to draw out a solidified ceramic material.

First, a material being composed of $(Y,Ba)_3Cu_2O_7$ was heated/molten by the crucible 2 of platinum, and a melt 3 thus obtained was drawn out from the high-temperature frame 4 of platinum having a portion of 1.0 mm in diameter for passing the melt 3 at a speed of 11 mm/min. Such drawout operation was stopped upon drawing out 100 mm of a $(Y,Ba)_3Cu_2O_7$ wire 10 of 1.0 mm in diameter, to examine its superconductivity. It has been confirmed that this wire superconducted at 50 K.

EXAMPLE 2

Figure 4:
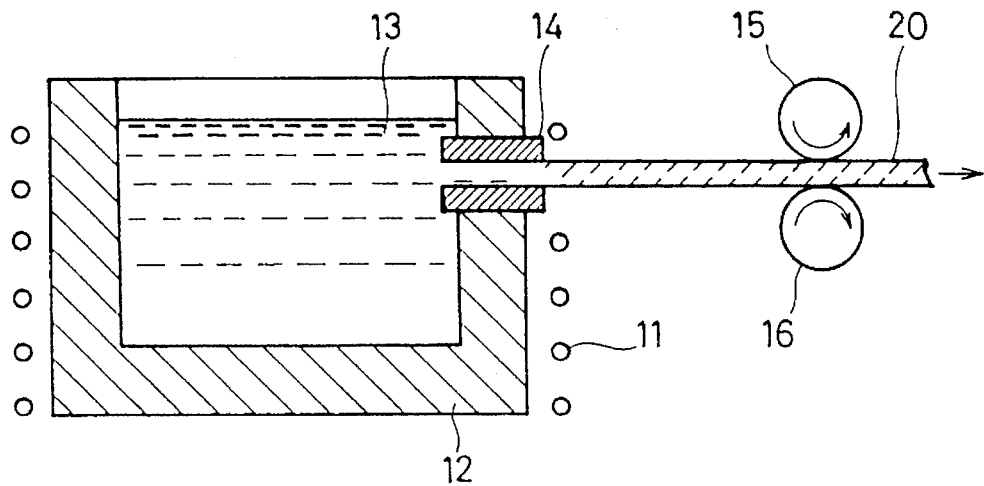
FIG. 4 is a sectional view schematically showing an apparatus employed for carrying out the second Example of the present invention.

An apparatus as shown in FIG. 4 was employed to obtain an elongated superconductor. The apparatus as shown in FIG. 4 comprises a crucible 12 having a heater 11 on its outer side, a high-temperature frame 14 provided on the side wall of the crucible 12 and rolls 15 and 16 for drawing out a solidified melt 13.

A material composed of $(La_{0.925}Sr_{0.075})_2CuO_4$ was heated/molten by the crucible 12 of PBN to draw out the melt 13 thus obtained from the high-temperature frame 14 of PBN having a portion of 0.5 mm in thickness and 10 mm in width for drawing out the melt 13, at a speed of 9 mm/min. Said drawout operation was stopped upon drawing out 50 m of the melt 13, to obtain a tape-like body 20 of $(La_{0.925}Sr_{0.075})_2CuO_4$ which was 0.5 mm in thickness and 10 mm in width. This tape-like body 20 superconducted at 41 K.

EXAMPLE 3

Figure 5:
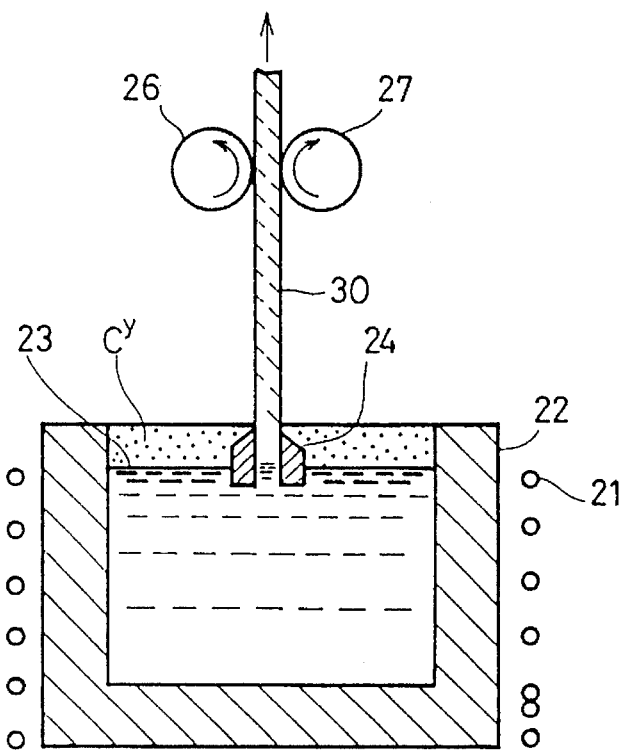
FIG. 5 is a sectional view schematically showing an apparatus employed for carrying out the third Example of the present invention.

An apparatus as shown in FIG. 5 was employed to obtain an elongated superconductor. Referring to FIG. 5, numeral 21 indicates a heater and numeral 22 indicates a crucible, while numeral 23 indicates a melt and numeral 24 indicates a high-temperature frame provided on the melt 23. This apparatus is so controlled that a $C^Y$ atmosphere is present above the melt 23. A pair of rolls 26 and 27 are provided further above the melt 23, to be rotated along arrows in the figure, in order to draw out a solidified ceramic material.

A mixture of $Y_2O_3$, $BaCO_3$ and $CuO$ was first molded and previously subjected to heat treatment. The compact thus obtained was heated/molten in the crucible 22 as shown in FIG. 5 under the $C^Y$ atmosphere containing oxygen of 200 Torr. A melt 23 thus obtained was drawn out from the high-temperature frame 24 having a hole of 1 mm in diameter for passing the melt 23, to be solidified in the form of a fine wire 30. It has been confirmed that the fine wire 30 thus obtained was a monocrystal body. This fine wire 30 was made of a ceramics superconductive material being composed of $(Y,Ba)_3Cu_2O_7$, and superconducted at 60 K.

EXAMPLE 4

Figure 6:
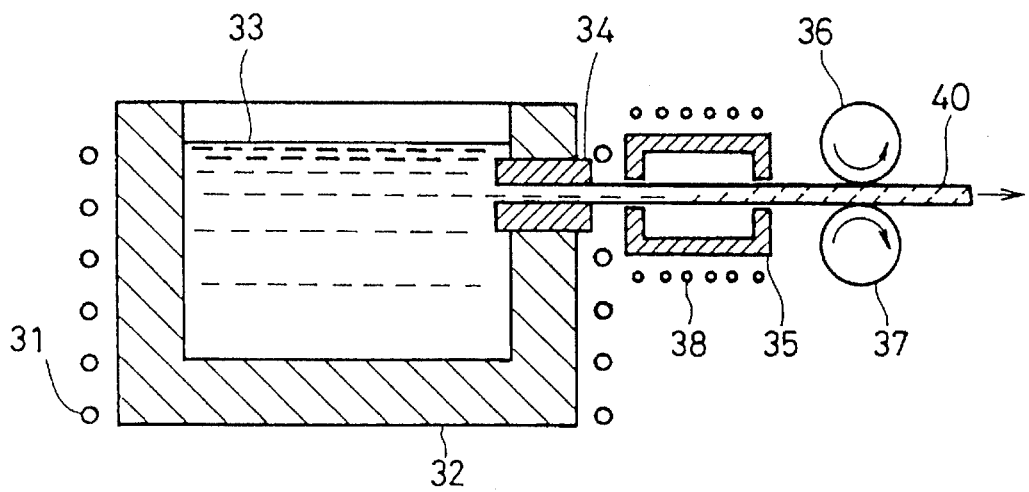
FIG. 6 is a sectional view schematically showing an apparatus employed for carrying out the fourth Example of the present invention.

An apparatus as shown in FIG. 6 was employed to obtain a ceramic superconductor. The apparatus as shown in FIG. 6 comprises a crucible 32 having a heater 31 on its outer side, a high-temperature frame 34 provided on the side wall of the crucible 32, an atmosphere furnace 35 externally adjacent to the high-temperature frame 34 and rolls 36 and 37 for drawing out a solidified melt. A heater 38 is also provided around the atmosphere furnace 35.

A material being of average composition of $La_{1.1}Sr_{0.34}CuO_x$ containing 0.01 wt. % of fluorine was first molten in the crucible 32 of the apparatus as shown in FIG. 6. A melt thus obtained was drawn out from the high-temperature frame 34 having a rectangular outlet hole of 0.3 mm in thickness and 10 mm in width and passed through the atmosphere furnace 35 under an atmosphere containing $SF_6$ gas of 100 Torr., to obtain a tape-like body 40 of 0.3 mm in thickness and 10 mm in width. This tape-like body 40 was recognized to be a unidirectionally solidified body, which superconducted at 42 K.

EXAMPLE 5

The fine wire obtained in Example 3 was heated under an atmosphere containing oxygen of 200 Torr. at a temperature of 950° C. for three hours. A ceramics superconductor thus obtained superconducted at 65 K.

EXAMPLE 6

Figure 7:
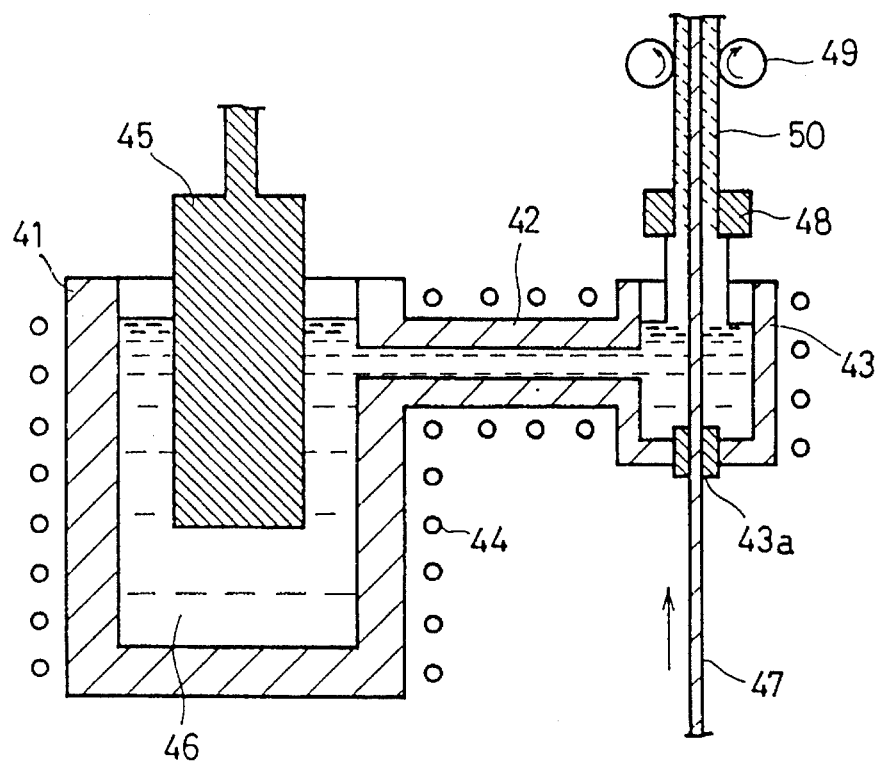
FIG. 7 is a sectional view schematically showing an apparatus employed for carrying out the fifth Example of the present invention.

FIG. 7 is a sectional view showing an apparatus for illustrating Example 6. Referring to FIG. 7, a frame portion 43 is provided on a vessel 41 through a communicating portion 42. A heater 44 is provided around the vessel 41, the communicating portion 42 and the frame portion 43. The vessel 41 stores a molten solution 46 of a superconductive material, which is guided into the frame portion 43 through the communicating portion 42. In order to continuously guide the molten solution 46 into the frame portion 43, it is necessary to regularly maintain the level of the molten solution 46 contained in the vessel 41 higher than the communicating portion 42. Thus, a level adjusting rod 45 is provided in the vessel 41 in order to adjust the level of the molten solution 46. The level adjusting rod 45 is vertically movable so that the volume of the molten solution 46 is increased through downward movement of the level adjusting rod, thereby raising the level of the molten solution 46.

An opening 43a is formed in the bottom of the frame portion 43, to receive a core member 47. A die 48 and rollers 49 are provided above the frame portion 43, to pass the core member 47 through the inner central portions thereof.

The core member 47 is upwardly fed to be passed through the molten solution 46 in the frame portion 43 from the opening 43a, so that the molten solution 46 is applied around the core member 47. The molten solution 46 is raised up with the core member 47 and passed through the die 48, to be shaped into a prescribed sectional configuration, while being cooled and solidified. Thus, the core member 47 is coated by the superconductive material to provide a superconductor 50, which is raised up by the roller 49. The amount of the molten solution 46 is gradually decreased during this coating of the core member 47, and hence the level adjusting rod 45 is downwardly moved to regularly adjust the level thereof.

A ceramic superconductive material composed of $(La_{0.925}Sr_{0.075})_2CuO_4$ was employed to manufacture a superconductor with the apparatus as shown in FIG. 7. The core member 47 was prepared by a platinum wire of 1.0 mm in diameter, and passed through the molten solution 46 in the frame portion 43 three times in total. Inner diameters of the opening 43a of the frame portion 43 and the die 48 were gradually increased each passage to increase the thickness of the superconductive material to be coated, thereby finally obtaining a superconductor 50 of 1.6 mm in diameter. The superconductor 50 thus obtained superconducted at 40 K.

EXAMPLE 7

Figure 8:
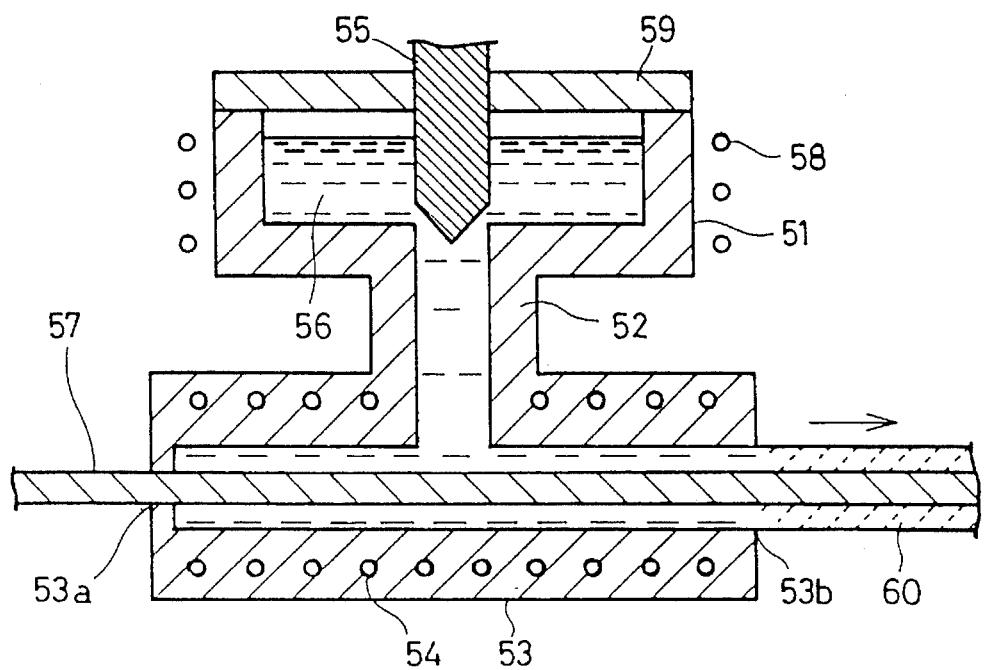
FIG. 8 is a sectional view schematically showing an apparatus employed for carrying out the sixth Example of the present invention.

FIG. 8 is a sectional view showing an apparatus for illustrating Example 7. Referring to FIG. 8, a vessel 51 contains a molten solution 56 of a superconductive material, and a frame portion 53 is provided under the vessel 51 through a communicating portion 52. A flow rate adjusting rod 55 is provided above the communicating portion 52, in order to adjust the flow rate of the molten solution 56 toward the frame portion 53. The forward end of the flow rate adjusting rod 55 is so tapered that a clearance between the tapered portion and an upper inlet of the communicating portion 52 is changed by vertical movement of the flow rate adjusting rod 55, thereby to adjust the flow rate of the molten solution 56 to be supplied to the frame portion 53.

The frame portion 53 has a hole horizontally passing through it to define openings 53a and 53b. The core member 57 is guided into the opening 53a, and is drawn out from the opening 53b. A heater 54 is provided in the frame portion 53. Another heater 58 is provided around the vessel 51 provided above the communicating portion 52.

The molten solution 56 heated by the heater 58 is passed through the clearance between the forward tapered portion of the flow rate adjusting rod 55 and the upper inlet of the communicating portion 52, to be guided into the frame portion 53 from the communicating portion 52. The core member 57 is passed through the horizontal hole of the frame portion 53 from the opening 53a toward the opening 53b, so that the molten solution 56 guided into the frame portion 53 is applied to the surface of the core member 57 in the vicinity of the opening 53b and drawn out from the frame portion 53. A melt thus coated on the surface of the core member 57 is cooled by the outside air or the like and solidified to form a superconductor 60. The frame portion 53 is heated by the heater 54 to a temperature exceeding the melting point of the superconductive material so that the molten solution 56 is not solidified in the frame portion 53. A lid 59 is provided on the vessel 51 to closely seal the vessel 51 against the outside air, so that the superconductive material can be molten under a desired atmosphere.

A superconductive material of $YBa_2Cu_3O_7$ was employed to manufacture a superconductor by the apparatus as shown in FIG. 8. The vessel 51 was provided in an atmosphere containing oxygen of 200 Torr., to melt the superconductive material. The core member 57 was prepared by a platinum wire of 0.8 mm in diameter. The core member 57 was fed at a speed of 40 mm/min. to finally obtain a superconductor 60 of 1.2 mm in diameter. The superconductor 60 thus obtained superconducted at 90 K.

In each of Examples 6 and 7, the thickness of the coated superconductive material can be adjusted by changing the inner diameter of the die 48 as shown in FIG. 7 or sectional size of the opening 53b as shown in FIG. 8, or controlling the speed for feeding the core member, or that for supplying the molten solution into the frame portion and the like.

Further, the sectional configuration of the coated superconductive material can be arbitrarily controlled by the sectional configuration of an inner hole of the die 48 as shown in FIG. 7 or the sectional configuration of the opening 53b as shown in FIG. 8.

Although the core member is formed by a platinum wire in each of Examples 6 and 7, such a core member may be prepared by any material in the present invention, so long as the same has a higher melting point than the superconductive material employed. Further, the core member can also be adapted to stabilize superconductivity, by preparing the same by a normal conduction material.

EXAMPLE 8

Powdered materials of $Y_2O_3$, $BaCO_3$ and $CuO$ were weighed to be in composition ratios of Y, Ba and Cu as listed in Table 1 and mixed with each other to be temporarily fired in the atmospheric air at 900° C. for 12 hours, thereby providing raw materials to be molten.

Such powdered materials were introduced into a platinum crucible to be molten in an oxygen atmosphere of 1 atm. at 1350° C., and thereafter directly solidified. Then the materials were held at 950° C. for 12 hours during temperature drop, and thereafter cooled to the room temperature at a speed of 150° C./h.

Samples of 2 mm×2 mm×30 mm in size were cut by a wire saw from solidified bodies thus obtained, and superconductivity transition temperatures (TC) were determined through measurement of electric resistance by a general four-terminal method. The values $T_C$ were decided to be temperatures at which the materials lost all resistance to electric current. Table 1 also shows the results of such measurements of electric resistance.

TABLE 1

| | Sample No. | Composition | Tc(K) |
|---|---|---|---|
| Example 8 | 1 | $Y_{0.3}Ba_{0.2}Cu_{0.5}O_x$ | 50 |
| | 2 | $Y_{0.2}Ba_{0.2}Cu_{0.6}O_x$ | 62 |
| | 3 | $Y_{0.3}Ba_{0.3}Cu_{0.4}O_x$ | 80 |
| | 4 | $Y_{0.2}Ba_{0.3}Cu_{0.5}O_x$ | 93 |
| | 5 | $Y_{0.1}Ba_{0.4}Cu_{0.5}O_x$ | 88 |
| | 6 | $Y_{0.1}Ba_{0.3}Cu_{0.6}O_x$ | 85 |
| Reference Example | 7 | $Y_{0.3}Ba_{0.1}Cu_{0.6}O_x$ | |
| | 8 | $Y_{0.5}Ba_{0.3}Cu_{0.2}O_x$ | |
| | 9 | $Y_{0.1}Ba_{0.5}Cu_{0.4}O_x$ | |

Table 1 shows no superconductivity transition temperatures $T_C$ for samples 7 to 9, which are reference examples, since superconductive states were not yet attained even at 2 K in these samples.

EXAMPLE 9

A composite oxide composed of $Y_{0.15}Ba_{0.3}Cu_{0.55}O_x$ was unidirectionally solidified in a platinum crucible under the atmosphere with oxygen partial pressure of 0.2 atm. by the Bridgeman method, at a speed of 2 mm/h. A solidified body thus obtained was held in an oxygen atmosphere of 1 atm. at 900° C. for three hours, and thereafter cooled to the room temperature at a speed of 200° C./h.

The solidified body thus obtained underwent transition into a superconductor at 90° K., and critical current density of current flowing in the direction of solidification was 1000 A/cm$^2$ at 77 K.

EXAMPLE 10

Powdered materials of $Bi_2O_3$, $SrCO_3$, $CaCo_3$ and CuO were weighed to be in composition ratio of Bi:Sr:Ca:Cu= 1:1:1:2 and mixed with each other to be temporarily fired in the atmospheric air at 800° C. for 8 hours, thereby to providing raw materials to be molten.

Such powder materials were introduced into a platinum crucible to be molten in the atmosphere at 1050° C., and thereafter drawn out and solidified by employing an apparatus as shown in FIG. 3. A fine wire of 1 mm in diameter was thus obtained. The fine wire was annealed at 830° C. for 8 hours and thereafter slow cooled.

The superconductivity transition temperature (TC) of the fine wire was determined through measurement of electric resistance by a general four-terminal method. The value $T_C$ was decided to be the temperature at which the materials lost all resistance to electric current, and was determined to be 100° K.

Although the present invention has been described and illustrated in detail, it is clearly understood that the invention is not limited in any way by said illustrations and examples and that the spirit and scope of the present invention are limited only by the terms of the appended claims.

What is claimed is:

1. A method of manufacturing a superconductor formed by a base material coated with a ceramic superconductor material of a composition AaBbCucOd, wherein A is at least one of Y, La, and Bi; B is at least one of Ca, Sr and Ba; and a,b, c, and d represent the relative molar ratios of A, B, Cu and O, said method comprising:

a step of preparing an elongated base material;

a step of preparing a raw material of said composition expressed in said general formula AaBbCc;

a step of passing said base material through a melt of said raw material to apply said melt to said base material; and a step of solidifying said melt on said base material by drawing said base material having said melt applied thereto out through a die portion having internal dimensions which define the external dimensions of a solidified body, said die portion being provided in an opening in a vessel.

2. A method of manufacturing a superconductor made of a superconductive material of Y—Ba—Cu—O, comprising:

a step of preparing a composite oxide of $YO_{1.5}$, BaO and CuO which is in a composition region enclosed by a first point showing 100 at. % CuO, a second point showing 50 at. % $YO_{1.5}$—25 at. % BaO—25 at. % CuO and a third point showing 50 at. % BaO—50 at. % CuO, excluding a line connecting said first and third points, in a three-component composition diagram of respective oxides of yttrium, barium and copper;

a step of melting said composite oxide to obtain a melt;

a step of solidifying said melt to obtain a solidified body, and a step of holding said solidified body in a temperature range of 800° to 1000° C. for at least two hours after said solidifying step and cooling the same at a cooling speed Of not more than 200° C./h.

3. A method of manufacturing a superconductor in accordance with claim 2, wherein said composition of $YO_{1.5}$, BaO and CuO is in a region enclosed by a fourth point showing 10 at. % $YO_{1.5}$—20 at. % BaO —70 at. % CuO, a fifth point showing 30 at. % $YO_{1.5}$—30 at. % BaO —40 at. % CuO and a sixth point showing 5 at. % $YO_{1.5}$—45 at. % BaO—50 at. % CuO.

4. A method of manufacturing a superconductor in accordance with claim 2, wherein said melting step is performed in a vessel of platinum.

5. A method of manufacturing a superconductor in accordance with claim 2, wherein said steps of holding said solidified body and cooling the same comprise steps performed in an oxygen atmosphere of at least 0.2 atm.

6. A method of manufacturing a superconductor in accordance with claim 2, wherein said melting step and said solidifying step comprise steps being performed in an oxygen atmosphere of at least 0.2 atm.

7. A method of manufacturing a superconductor in accordance with claim 2, wherein;

said melting step and said solidifying step comprise a step of melting said composite oxide in a vessel having an opening to obtain a melt, and a step of solidifying said melt by drawing out said melt through a die having internal dimensions which define the external dimensions of a solidified body, said die provided in an opening portion.

8. A method of manufacturing a superconductor made of ceramic superconductive material of a composition AaBbCucOd, wherein A is at least one of Y, La, and Bi; B is at least one of Ca, Sr, and Ba; and a,b, c, and d represent the relative molar ratios of A, B, Cu and O, said method comprising:

preparing a raw material of a composition generally expressed in a formula AaBbCucC$^x$c$^x$, wherein C$^x$ represents at least a single element selected from the group consisting of oxygen, carbon, nitrogen, fluorine and sulphur and $c^x$ represents a number showing the composition ratio of $C^x$;

melting said raw material in a vessel having an opening to obtain a melt; and solidifying said melt by drawing out said melt through a die having internal dimensions which define the external dimensions of a solidified body, said die provided in said opening in said vessel, wherein at least one of said steps of melting said raw material and solidifying said melt is performed in an atmosphere containing a $C^Y$ component having a partial pressure in said atmosphere which is higher than the partial pressure of said $C^Y$ component in air, said $C^Y$ component comprising a gas containing at least a single element selected from the group consisting of oxygen, nitrogen, carbon, fluorine and sulphur to form a superconductor.

9. A method of manufacturing a superconductor in accordance with claim 8, wherein said combination of said $C^x$ component and said $C^Y$ component is identical to said O component of said superconductor.

10. A method of manufacturing a superconductor in accordance with claim 8, wherein (a) said melting step is performed in an atmosphere containing said $C^Y$ component; and (b) the partial pressure of said $C^Y$ component in said atmosphere containing said $C^Y$ component is higher than the partial pressure of said $C^Y$ component in air.

11. A method of manufacturing a superconductor in accordance with claim 8, wherein (a) said solidifying step is performed in an atmosphere containing said $C^Y$ component; and (b) the partial pressure of said $C^Y$ component in said atmosphere containing said $C^Y$ component is higher than the partial pressure of said $C^Y$ component in air.

12. A method of manufacturing a superconductor in accordance with claim 8, wherein (a) a step of reheating said solidified body is performed after said solidifying step in an atmosphere containing in said $C^Y$ component; and (b) the partial pressure of said $C^Y$ component in said atmosphere containing said $C^Y$ component is higher than the partial pressure of said $C^Y$ component in air.

* * * * *